United States Patent
Shimoda et al.

(10) Patent No.: US 8,354,285 B2
(45) Date of Patent: Jan. 15, 2013

(54) LIGHT EMITTING PANEL AND MANUFACTURING METHOD OF LIGHT EMITTING PANEL

(75) Inventors: Satoru Shimoda, Tokyo (JP); Hiroshi Matsumoto, Higashiyamato (JP)

(73) Assignee: Casio Computer Co., Ltd., Tokyo (JP)

( * ) Notice: Subject to any disclaimer, the term of this patent is extended or adjusted under 35 U.S.C. 154(b) by 127 days.

(21) Appl. No.: 12/880,341

(22) Filed: Sep. 13, 2010

(65) Prior Publication Data
US 2011/0062458 A1    Mar. 17, 2011

(30) Foreign Application Priority Data
Sep. 14, 2009   (JP) ................................. 2009-211230

(51) Int. Cl.
*H01L 33/00* (2010.01)
(52) U.S. Cl. .................... 438/28; 257/72; 257/E27.119; 313/500
(58) Field of Classification Search ...................... 438/28
See application file for complete search history.

(56) References Cited

U.S. PATENT DOCUMENTS

| | | | |
|---|---|---|---|
| 6,750,476 B2 | 6/2004 | Katayama | |
| 7,498,733 B2 * | 3/2009 | Shimoda et al. | 313/500 |
| 7,710,019 B2 * | 5/2010 | Jung et al. | 313/504 |
| 7,981,484 B2 | 7/2011 | Kumagai | |
| 2008/0018243 A1 * | 1/2008 | Ishiguro et al. | 313/506 |
| 2008/0042553 A1 * | 2/2008 | Li | 313/501 |

FOREIGN PATENT DOCUMENTS

| | | |
|---|---|---|
| JP | 2004-063286 A | 2/2004 |
| JP | 2007-234391 A | 9/2007 |
| KR | 10-2002-0075287 A | 10/2002 |
| KR | 10-2007-0036700 A | 4/2007 |

OTHER PUBLICATIONS

Korean Office Action dated Mar. 14, 2012 (and English translation thereof) in counterpart Korean Application No. 10-2010-0089393.

* cited by examiner

*Primary Examiner* — Jerome Jackson, Jr.
(74) *Attorney, Agent, or Firm* — Holtz, Holtz, Goodman & Chick, PC

(57) ABSTRACT

Disclosed is a light emitting panel including: a light blocking section formed above a substrate, the light blocking section including an opening; a first electrode formed above the opening of the light blocking section; a dividing wall including an opening so that at least a portion of the first electrode is exposed, the opening corresponding to a shape of the opening of the light blocking section; a second electrode formed above the first electrode; and a carrier transport layer composed of at least one layer formed between the first electrode and the second electrode.

6 Claims, 12 Drawing Sheets

EXPOSING LIGHT

LIGHT EMITTING PANEL AND MANUFACTURING METHOD OF LIGHT EMITTING PANEL

BACKGROUND OF THE INVENTION

1. Field of the Invention

The present invention relates to a light emitting panel and a manufacturing method of the light emitting panel.

2. Description of the Related Art

An organic electroluminescence element (organic EL element) is composed of a laminated structure of layers such as an electron injecting layer, light emitting layer and hole injecting layer between a cathode electrode and an anode electrode. When a forward bias voltage is applied between the anode electrode and the cathode electrode, an electron is injected from the electron injecting layer to the light emitting layer, a hole is injected from the hole injecting layer to the light emitting layer and the electron and the hole recombines in the light emitting layer so that the light emitting layer emits light.

The light emitting layer and the hole injecting layer includes an organic compound. The layers are formed by applying an organic compound solution in which the material is dissolved in a solvent on the electrode of each pixel and then the solution is dried. In order to prevent mixed color on a color display, a dividing wall is formed between adjacent pixels to prevent mixing of the organic compound solution (for example, see Japanese Patent Application Laid-Open Publication No. 2007-234391).

As a method to form the dividing wall, for example there is a method to apply photosensitive resin on a substrate and to form a pattern using a photomask. However, a photomask for forming the dividing wall needs to be manufactured separately. Also, when the accuracy of the alignment of the photomask is low, a margin adjusted to the accuracy needs to be set, and there is a problem that a ratio of area of the light emitting area in one pixel area (aperture ratio) becomes low.

SUMMARY OF THE INVENTION

The present invention has been made in consideration of the above situation, and one of the main objects is to reduce the number of photomasks used when a light emitting panel is manufactured and to enhance aperture ratio.

In order to achieve any one of the above advantages, according to an aspect of the present invention, there is provided a light emitting panel including:

a light blocking section formed above a substrate, the light blocking section including an opening;

a first electrode formed above the opening of the light blocking section;

a dividing wall including an opening so that at least a portion of the first electrode is exposed, the opening corresponding to a shape of the opening of the light blocking section;

a second electrode formed above the first electrode; and a carrier transport layer composed of at least one layer formed between the first electrode and the second electrode.

According to another aspect of the present invention, there is provided a manufacturing method of a light emitting panel including a first electrode formed on a substrate; a second electrode formed above the first electrode; a carrier transport layer composed of at least one layer formed between the first electrode and the second electrode, the method including:

applying a positive type photosensitive resin on an upper side of the substrate provided with a light blocking section including an opening;

forming a dividing wall including an opening with a shape corresponding to a shape of the opening of the light blocking section by emitting light to the positive type photosensitive resin side from a bottom surface of the substrate with the light blocking section as a mask.

According to another aspect of the present invention, there is provided a light emitting panel including a first electrode formed on a substrate; a second electrode formed above the first electrode; a carrier transport layer composed of at least one layer formed between the first electrode and the second electrode, the light emitting panel including:

a dividing wall including an opening in a shape corresponding to a shape of an opening of a light blocking section, the dividing wall formed by applying a positive type photosensitive resin on an upper surface side of the substrate provided with the light blocking section including the opening and emitting light to the positive type photosensitive resin side from a bottom surface of the substrate with the light blocking section as a mask.

BRIEF DESCRIPTION OF THE DRAWINGS

The present invention and the above-described objects, features and advantages thereof will become more fully understood from the following detailed description with the accompanying drawings and wherein.

DETAILED DESCRIPTION OF THE PREFERRED EMBODIMENTS

Preferred embodiments for carrying out the present embodiment is described in detail with reference to the drawings. The embodiments described below include various technically preferable limitations to carry out the present invention, however, the scope of the invention is not limited to the embodiments and the illustrated examples.

In the description below, the word Electro Luminescence is abbreviated to EL.

Figure 1:
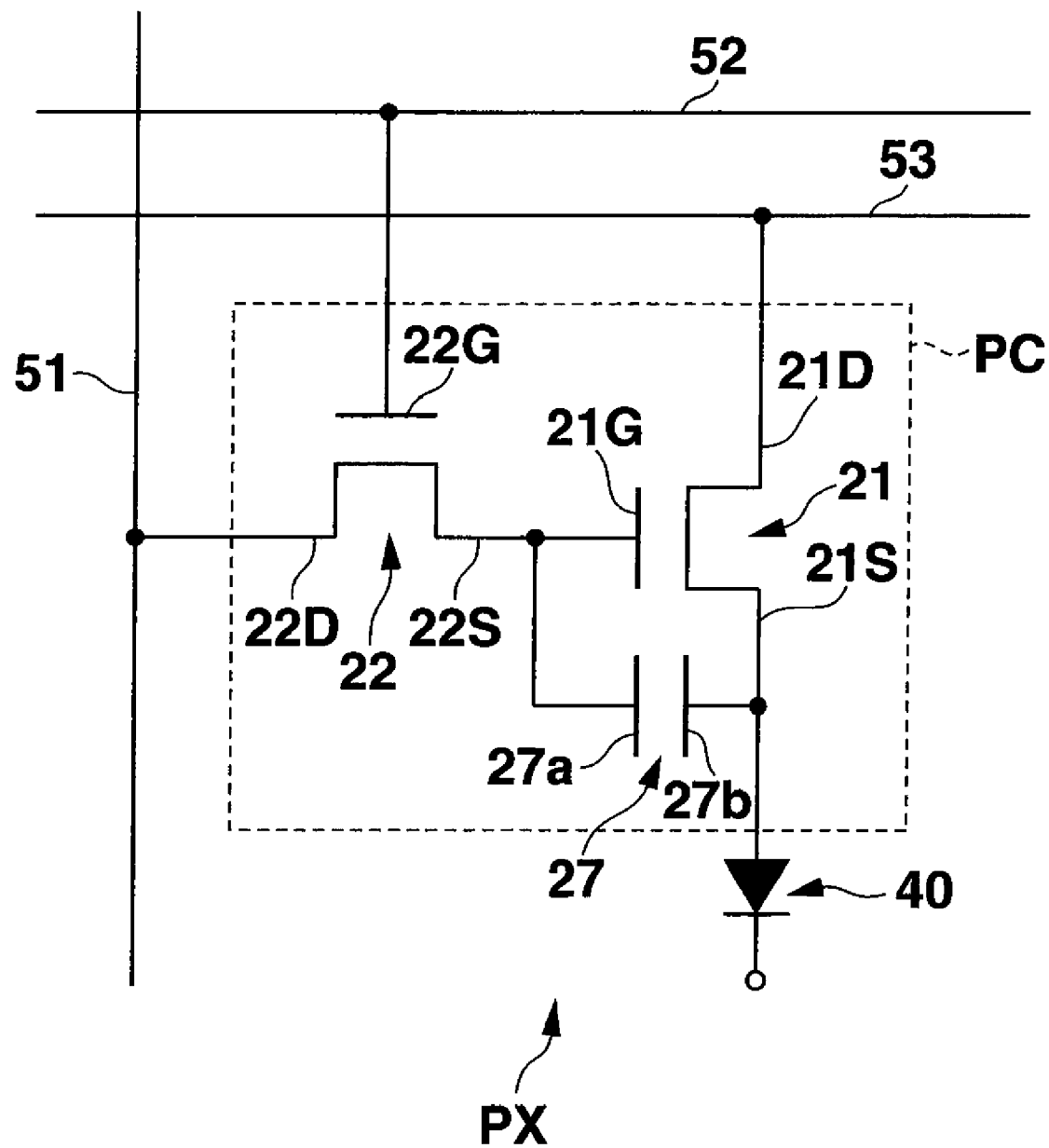
FIG. 1 is a circuit diagram of a pixel PX of the organic EL display panel 10.

FIG. 1 is a circuit diagram of a pixel PX of the organic EL display panel 10 of the first embodiment of the preferred embodiments. In the organic EL display panel 10, pixel PX of red, blue and green compose a pixel of one dot and such pixels are aligned on an entire area of a display area in a matrix. Focusing on an arrangement in a horizontal direction shown in FIG. 1, a red pixel PX, a blue pixel PX, and a green pixel PX are arranged repeatedly in this order and focusing on an arrangement in a vertical direction shown in FIG. 1, the same color is arranged in one column.

The organic EL display panel 10 is provided with a plurality of signal lines 51, scanning lines 52 and common power source lines 53 to output various signals to the pixel PX. The scanning line 52 and the signal line 51 extend in a direction orthogonal to each other and the signal line 51 extends in a vertical direction shown in FIG. 1 and the scanning line 52 and the common power source line 53 extends in a horizontal direction shown in FIG. 1.

The pixel PX includes a pixel circuit PC including two n-channel type transistors 21 and 22 and capacitor 27 and an organic EL element 40. The two n-channel type transistors 21 and 22 and the capacitor 27 apply voltage to the organic EL element 40 according to the input signal of the signal line 51, the scanning line 52 and the common power source line 53.

Figure 2:
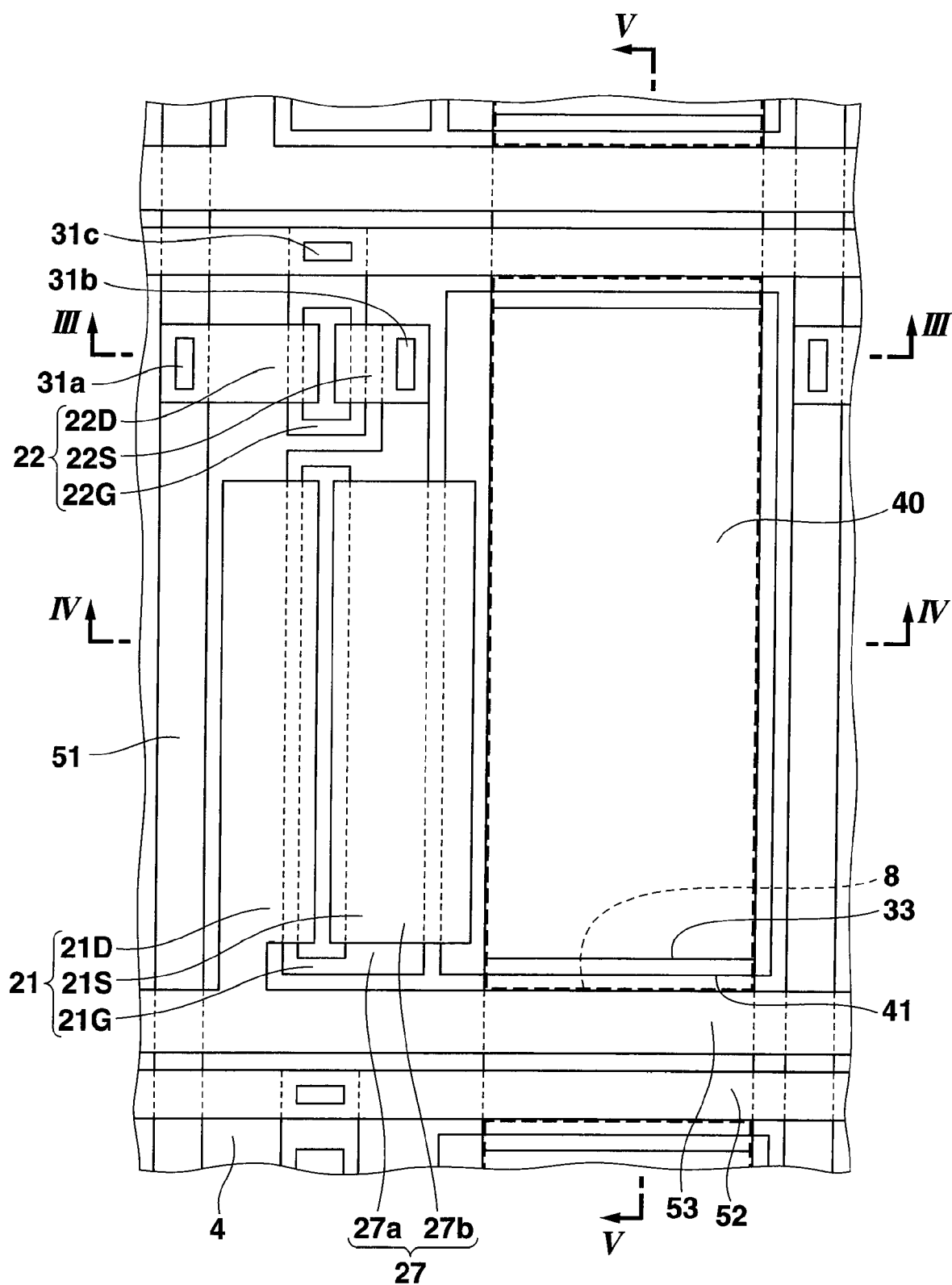
FIG. 2 is planar view showing one pixel PX.
Figure 3:
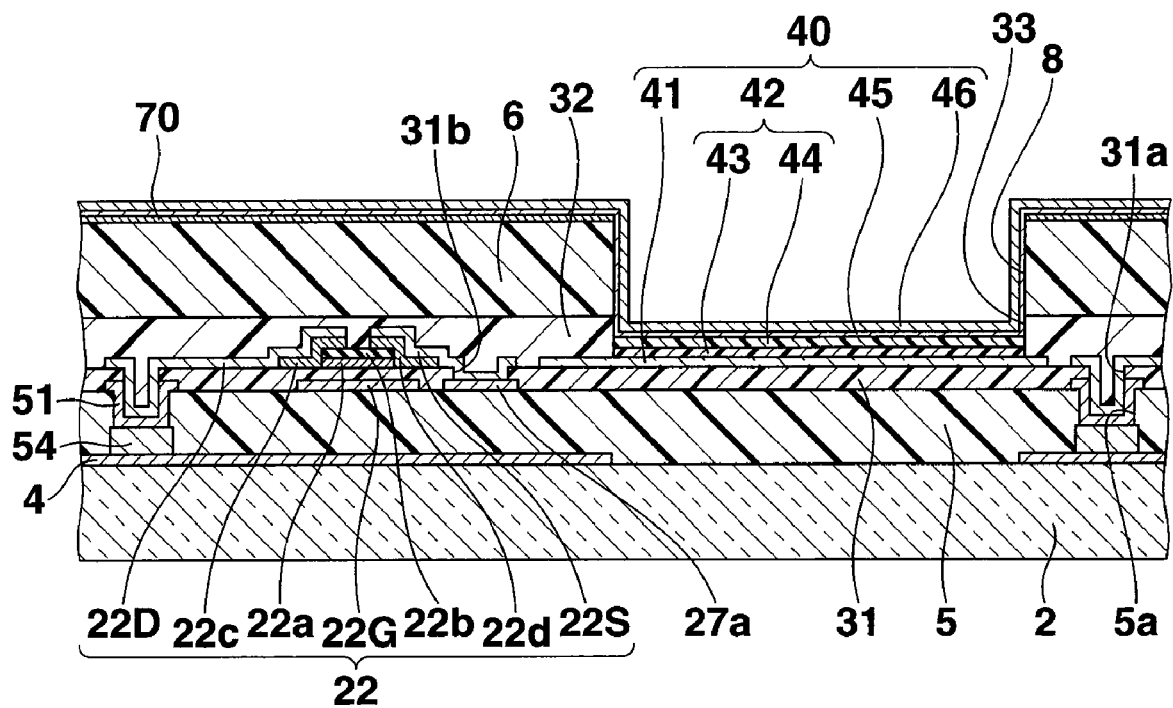
FIG. 3 is a cross sectional view viewed along arrow III-III shown in FIG. 2.
Figure 4:
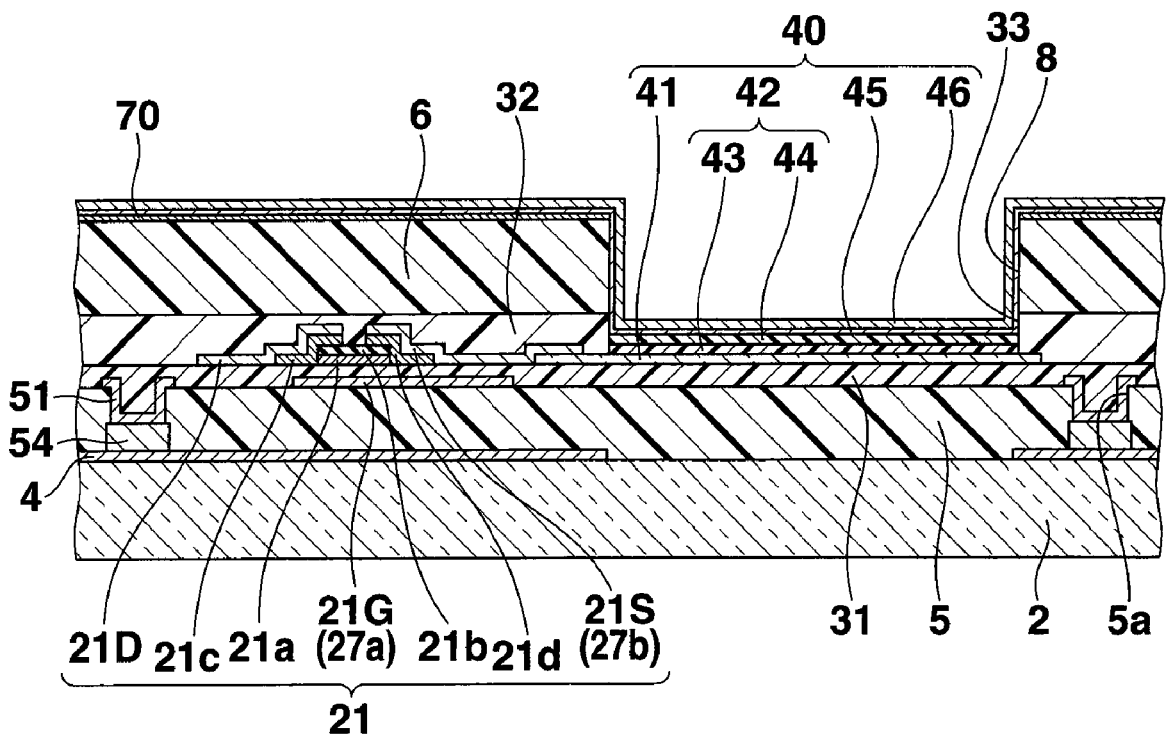
FIG. 4 is a cross sectional view viewed along arrow IV-IV shown in FIG. 2.
Figure 5:
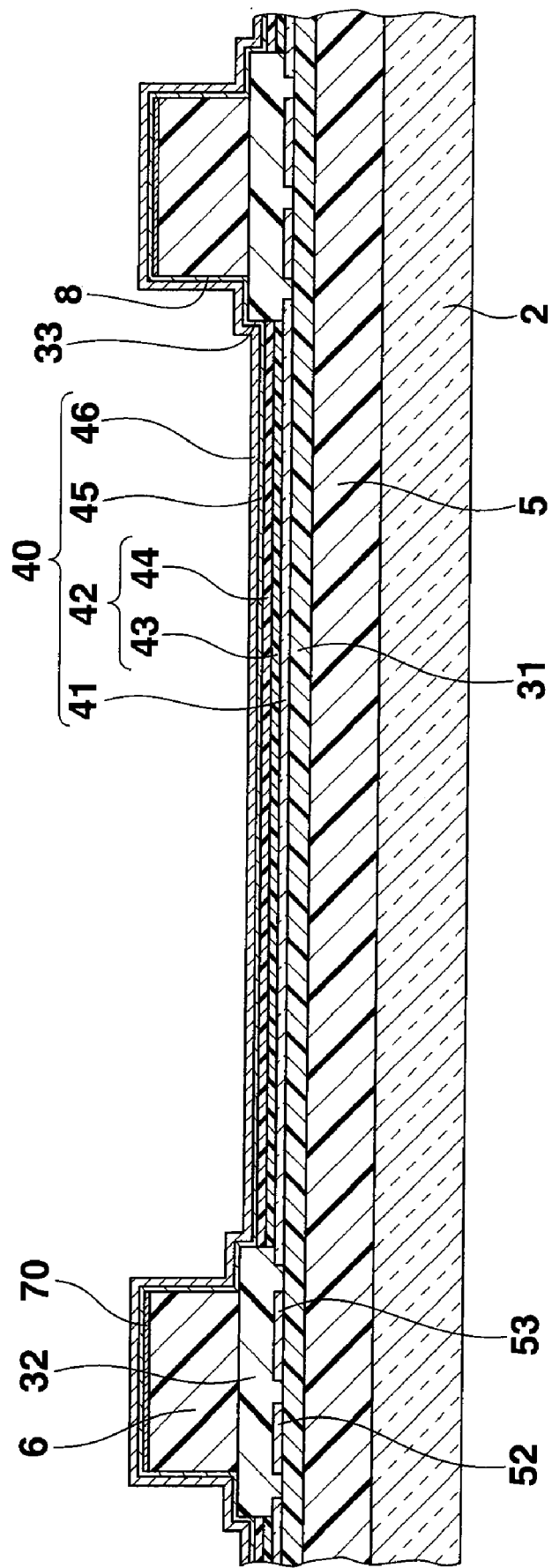
FIG. 5 is a cross sectional view viewed along arrow V-V shown in FIG. 2.

FIG. 2 is a planar view showing a pixel PX, FIG. 3 is a cross sectional view viewed along arrow III-III shown in FIG. 2, FIG. 4 is a cross sectional view viewed along arrow IV-IV shown in FIG. 2, and FIG. 5 is a cross sectional view viewed along arrow V-V shown in FIG. 2. The horizontal direction and the vertical direction of FIG. 1 correspond with those of FIG. 2.

As shown in FIG. 2 to FIG. 5, a light blocking film 4 is formed with a space between each other in a horizontal direction shown in FIG. 2 between a portion where the organic EL elements 40 are formed arranged in a matrix on a transparent insulating substrate 2. The light blocking film 4 can be formed integrated outside the display area of the organic EL display panel 10.

Material used as a material of the light blocking film 4 is a material with a low light reflectance and a conductive material such as metal which is not etched by an etchant used when an auxiliary signal line 54 is formed above the light blocking film 4, for example chrome, or compounds of chrome such as chromic oxide, chromic nitride, or chromic oxide nitride. Such material is formed as a film with a thickness of about 50 to 150 nm to form the light blocking film 4. Thin film of the above can be laminated to form the light blocking film 4. The light blocking film 4 prevents light from entering the transistors 21 and 22 from the insulating substrate 2 side. Therefore, light leaking and light degradation of the transistors 21 and 22 can be prevented. Also, by using material with low light reflectance, an effect similar to when a black matrix is formed can be obtained, which is to prevent mixed color when adjacent pixels emit light simultaneously to enhance display quality.

The auxiliary signal line 54 is provided in a portion where the signal line 51 is formed on the light blocking film 4. The auxiliary signal line 54 includes an alloy including at least Al such as Al, AlTi, AlTiNd, etc., copper or silver or an alloy including copper or silver and is in a conduction state with the light blocking film 4. The auxiliary signal line 54 can be formed by for example, forming a metal film with a thickness of about 200 to 500 nm with a sputtering method and then etching using a photosensitive resist. Also, the auxiliary signal line 54 can be formed by laminating a metal foil with a thickness of 0.5 μm to 5 μm. The light blocking film 4 and the signal line 51 are in a conduction state through the auxiliary signal line 54 and this prevents the floating electric potential of the light blocking film 4. Also, the auxiliary signal line 54 and the signal line 51 are formed together so that the signal line 51 is low in resistance and this prevents delay of signal, decrease of signal voltage and Joule heat. The auxiliary signal line 54 can be laminated with a barrier metal such as Cr, etc. to prevent battery reaction.

The light blocking film 4 and the signal line 51 are covered with a flattening film 5. Also, a contact hole 5a is formed in the flattening film 5 on the auxiliary signal line 54.

The flattening film 5 can be formed by forming a film of an inorganic insulating material such as $SiO_2$, SiN, SiON, etc. of about 100 to 10000 nm with a CVD method or sputtering method. The flattening film 5 can be formed by applying an organic insulating material such as polysiloxane, polyimide, acrylic resin, fluorine resin, etc. The film of the organic insulating material and the film of the inorganic insulating material can be laminated. It is suitable to form the film of the inorganic insulating material on the film of the organic insulating material, because the gas, etc. caused by the film of the organic insulating material can be blocked. It is also preferable that the flattening film 5 is light permeable.

The organic insulating material can be photosensitive and developing processing can be performed to form the desirable contact hole 5a.

The thickness of the flattening film 5 can be about 100 to 10000 nm, however, it is not limited to this thickness if the thickness is about two times that of the auxiliary signal line 54.

Gate electrodes 21G and 22G of the transistors 21 and 22 are provided on the flattening film 5 and one of the electrodes 27a of the capacitor 27 and the signal line 51 are also provided on the flattening film 5. The gate electrodes 21G and 22G, the electrode 27a and the signal line 51 are formed by patterning a thin film of, for example, Al, AlTi, AlTiNd, MoNb, etc. As shown in FIG. 2, the electrode 27a and the gate electrode 21 are formed integrated. A portion of the signal line 51 is formed in the contact hole 5a and is in a conduction state with the auxiliary signal line 54.

The gate electrodes 21G and 22G, electrode 27a and signal line 51 are covered by a common gate insulating film 31. The gate insulating film 31 can be formed by forming a film of an inorganic insulating material such as $SiO_2$, SiN, SiON, etc. by a CVD method or sputtering method.

Also, in the gate insulating film 31, a contact hole 31a is formed on the signal line 51 on a portion which overlaps with the drain electrode 22D of the transistor 22, a contact hole 31b is formed on one of the electrodes 27a of the capacitor 27 on a portion which overlaps with the source electrode 22S of the transistor 22, and a contact hole 31c is formed on the gate electrode 22G of the transistor 22 on a portion which overlaps with the scanning line 52.

As shown in FIG. 2 to FIG. 5, transparent pixel electrodes (first electrode) 41 are aligned in a matrix on the gate insulating film 31. These pixel electrodes 41 are formed by patterning a conductive film (for example, tin doped indium oxide (ITO), zinc doped indium oxide, indium oxide ($In_2O_3$), tin oxide ($SnO_2$), zinc oxide (ZnO) or cadmium-tin oxide (CTO)) using a photolithography method and etching method.

Also, the other electrode 27b of the capacitor 27, semiconductor films 21a and 22a of the transistors 21 and 22, channel protecting films 21b and 22b, n-type semiconductor films 21c, 21d, 22c and 22d, source electrodes 21S and 22S and drain electrodes 21D and 22D, and scanning line 52 and common power source line 53 are provided on the gate insulating film 31. The scanning line 52 and the common power source line 53 compose a light blocking section with the light blocking film 4.

The semiconductor films 21a and 22a are formed on the gate electrodes 21G and 22G and are formed by forming a film including, for example, amorphous silicon (a-Si), etc. to pattern the film. The channel protecting films 21b and 22b are formed on the semiconductor films 21a and 22a and are formed by forming a film including, an inorganic insulating material such as $SiO_2$, SiN, SiON, etc. to pattern the film.

A portion of the n-type semiconductor films 21c, 21d, 22c and 22d are formed to overlap with the channel protecting films 21b and 22b.

The scanning line 52 and the common power source line 53 are formed in a horizontal direction shown in FIG. 2 between the pixel electrodes 41 aligned in a matrix.

The drain electrode 21D is formed integrated with the common power source line 53 and the source electrode 21S and the electrode 27b are formed integrated. A portion of the source electrode 21S is formed to overlap with a portion of the pixel electrode 41 and is in a conduction state with the pixel electrode 41.

A portion of the drain electrode 22D is formed in the contact hole 31a, and is in a conduction state with the signal line 51. A portion of the source electrode 22S is formed in the contact hole 31b, and is in a conduction state with the electrode 27a. A portion of the scanning line 52 is formed in the contact hole 31c and is in a conduction state with the gate electrode 22G.

The source electrodes 21S and 22S and the drain electrodes 21D and 22D of the transistors 21 and 22, the other electrode 27b of the capacitor 27, the scanning line 52 and the common power source line 53 and pixel electrode 41 are covered with a common protective insulating film (second dividing wall) 32. The protective insulating film 32 can be formed by forming a film including an inorganic insulating material such as $SiO_2$, SiN, SiON, etc. with a CVD method or sputtering method.

An opening section 33 is formed in the portion of the pixel electrode 41 of the protective insulating film 32 to expose at least a portion of the pixel electrode 41. By forming the opening section 33, the protective insulating film 32 is formed in a net configuration threaded between the pixel electrodes 41 and overlaps a portion of the outer edge section of the pixel electrode 41 to surround the pixel electrode 41. A later described organic EL layer 42 is formed in the opening section 33.

The laminated configuration from the insulating substrate 2 to the protective insulating film 32, is the transistor array panel 100.

A dividing wall (first dividing wall) 6 in a net configuration is formed on the transistor array panel 100 in a position corresponding to the light blocking film 4, scanning line 52 and common power source line 53 and at least a portion of the pixel electrode 41 is exposed from an opening 8 of the dividing wall 6. The dividing wall 6 is formed from a positive type photosensitive resin such as polyimide, etc. and thicker enough than each electrode of the transistors 21 and 22, signal line 51, scanning line 52, common power source line 53. The dividing wall 6 is formed by exposing light on the back face from the insulating substrate 2 side using the light blocking section composed of the light blocking film 4, scanning line 52 and common power source line 53 as the mask. The shape of the light blocking film 4, the scanning line 52 and the common power source line 53 corresponds to the shape of the dividing wall 6. The shape of the opening 8 of the dividing wall 6 corresponds to the shape of the opening surrounded by the light blocking film 4, scanning line 52, and common power source line 53 of the light blocking section.

Liquid repellent processing is performed on an upper surface of the dividing wall 6 by the liquid repellent agent 70. The liquid repellent processing is performed by applying a liquid repellent agent composed of a compound including a heterocycle including at least one nitrogen atom on the cycle, a plurality of thiol groups, and an alkyl fluoride group connected through the thiol group. Such liquid repellent agent includes, for example, triazine thiol alkyl fluoride derivative.

The hole injecting layer 43 and the light emitting layer 44 are laminated in order on the pixel electrode 41 to form the organic EL layer 42 (carrier transport layer). The hole injecting layer 43 includes PEDOT which is a conductive polymer and PSS which is a dopant and the light emitting layer 44 includes a conjugated polymer such as light emitting material of polyphenylene vinylene system, light emitting material of polyfluorene system, etc. The material is set so that when the sub-pixel is red, the red of the light emitting layer 44 emits light, when the sub-pixel is green, the green of the light emitting layer 44 emits light and when the sub-pixel is blue, the blue of the light emitting layer 44 emits light.

The hole injecting layer 43 and the light emitting layer 44 are formed by a wet type applying method (for example, ink-jet printing method). In this case, a liquid including an organic compound including PEDOT and PSS which is to be the hole injecting layer 43 is applied on the pixel electrode 41 to form the film and then a liquid including an organic compound including conjugated polymer light emitting material which is to be the light emitting layer 44 is applied to form the film. A dividing wall 6 with a thick film is provided to prevent the liquid including the organic compound applied to adjacent pixel electrodes 41 from crossing over the dividing wall 6 and mixing.

An electron transport layer can be further provided on the light emitting layer 44. The organic EL layer 42 can be a two layer configuration including a light emitting layer and an electron transport layer formed on the pixel electrode 41 and the combination of the carrier transport layer and the light emitting layer can be set freely. Also, a laminated configuration can include an inter layer between suitable layers of the layer configuration to restrict carrier transport or other laminated configuration can be applied.

An electron injecting layer 45 which is to be a portion of the cathode of the organic EL element 40 is formed on the light emitting layer 44, protective insulating film 32 and dividing wall 6. The electron injecting layer 45 is formed from a material with a lower work function than the pixel electrode 41 and for example, is formed from a single body or an alloy including at least one type of alkali metal or alkali earth metal such as indium, magnesium, calcium, lithium, barium, etc., or rare earth metal with a thickness of 1 to 10 nm. Alternatively, the electron injecting layer 45 can be a laminated configuration of laminated layers of the above various material.

An opposing electrode (second electrode) 46 which is a portion of the cathode is formed from a conductive material such as aluminum, chrome, silver or an alloy of palladium silver system with a vapor deposition method on the electron injecting layer 45.

The pixel electrode 41, the organic EL layer 42, the electron injecting layer 45 and the opposing electrode 46 are laminated in order to be the organic EL element 40.

Figure 6:
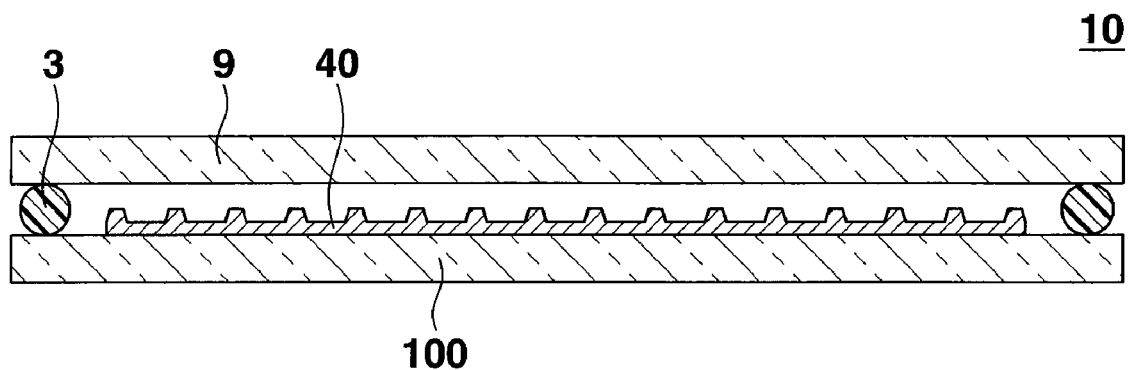
FIG. 6 is a cross sectional view showing an organic EL display panel 10 of the present embodiment.

As shown in FIG. 6, on the transistor array panel 100 on which the organic EL element 40 is formed, an adhesive agent 3 is applied as a sealing member around the outside periphery of the face where the opposing electrode 46 is formed. With the adhesive agent 3, the organic EL element 40 is sealed by connecting the substrate 2 and the opposing substrate 9. With this, the organic EL display panel 10 is formed. The organic EL element 40 includes a bottom emission type light emitting configuration, and the light emitted from the organic EL layer 42 is emitted through the pixel electrode 41 and the insulating substrate 2 to the other face side (bottom of FIG. 3 to FIG. 5) of the insulating substrate 2.

Next, the manufacturing process of the EL display panel 10 is described.

Figure 7:
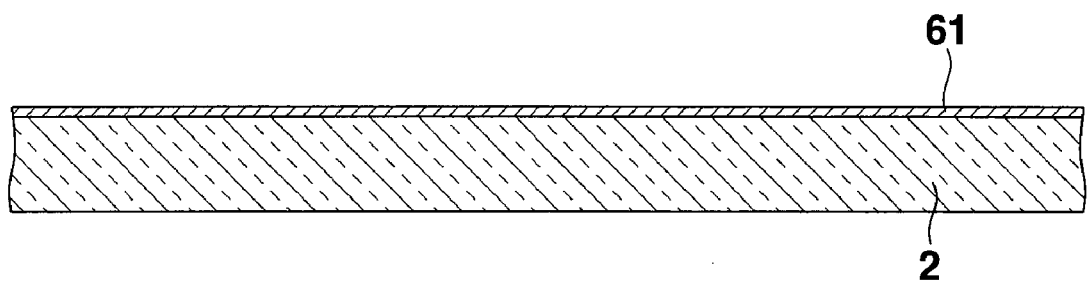
FIG. 7 is a cross sectional view to explain a manufacturing step to manufacture the organic EL display panel 10 of a cross sectional view shown in FIG. 3.
Figure 8:
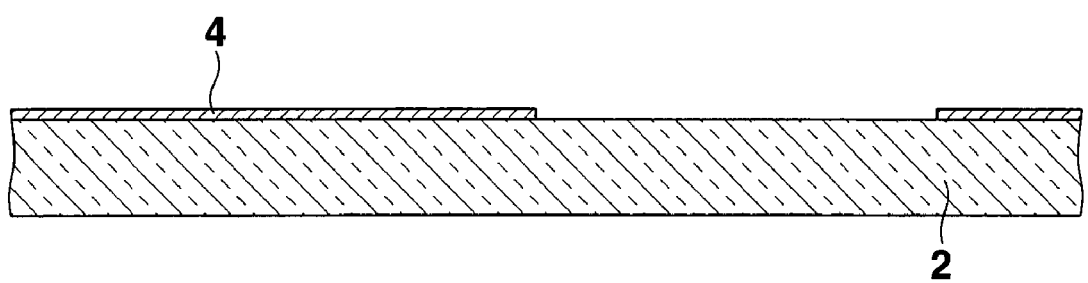
FIG. 8 is a cross sectional view to explain a manufacturing step to manufacture the organic EL display panel 10 of a cross sectional view shown in FIG. 3.

First, as shown in FIG. 7, a metal film 61 is formed on the insulating substrate 2 so that the thickness is 50 to 150 nm by a sputtering method, etc. where chromium oxide, chromium nitride, chromium oxide nitride, etc., which are to be the material of the light blocking film, are targets. Next, photosensitive resist is used to perform wet etching on the metal film 61 with an etchant including cerium ammonium nitrate so that a desired pattern of the light blocking film 4 remains as shown in FIG. 8.

Figure 9:
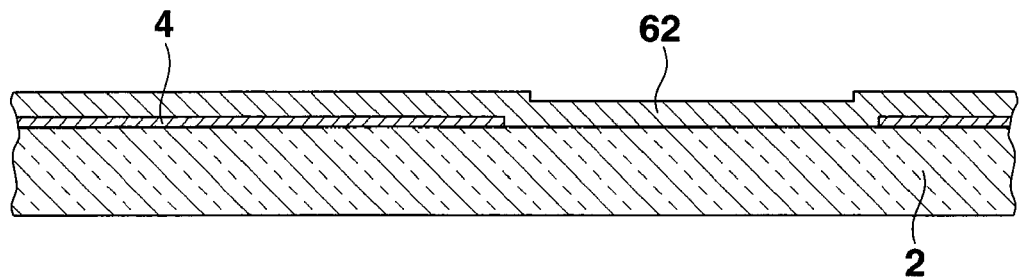
FIG. 9 is a cross sectional view to explain a manufacturing step to manufacture the organic EL display panel 10 of a cross sectional view shown in FIG. 3.

Next, as shown in FIG. 9, a metal film (auxiliary signal line metal 62) with a thickness of about 200 to 500 nm is formed. In order to form an auxiliary signal line metal 62, there is a sputtering method where metal including at least Al such as, Al, AlTi, AlTiNd, etc., or copper, silver, or alloys thereof are targets. Alternatively, metal thin film such as Al, AlTi, AlTiNd, copper, silver, etc. can be pasted by a conductive adhesive agent.

Figure 10:
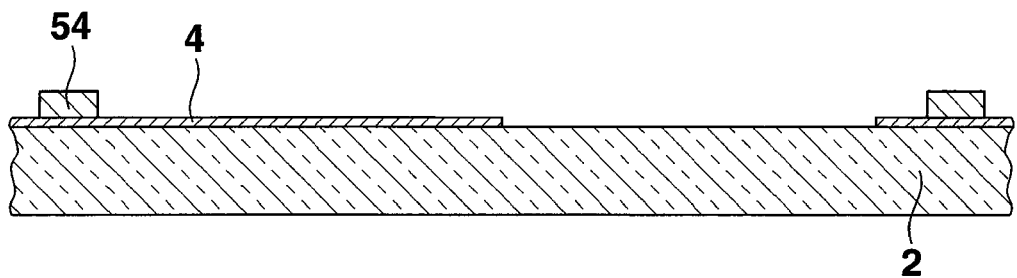
FIG. 10 is a cross sectional view to explain a manufacturing step to manufacture the organic EL display panel 10 of a cross sectional view shown in FIG. 3.

Next, the auxiliary signal line 54 is formed as shown in FIG. 10 by etching the auxiliary signal line metal 62 using the photosensitive resist. As an etchant of the Al alloy system, Nagase Al etchant can be used. As an etchant of copper or an alloy including copper, Cu-1 copper etching liquid, etc. of Kanto Chemical can be used, and as an etchant including silver or an alloy including silver, SEA-1 silver etching liquid, etc. of Kanto Chemical can be used.

Figure 11:
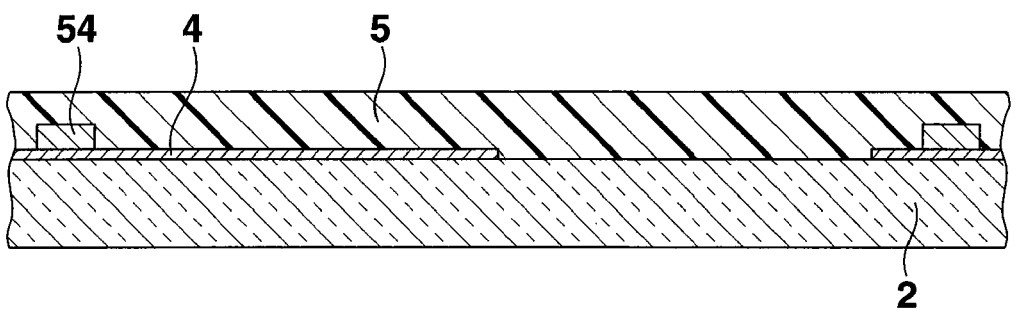
FIG. 11 is a cross sectional view to explain a manufacturing step to manufacture the organic EL display panel 10 of a cross sectional view shown in FIG. 3.
Figure 12:
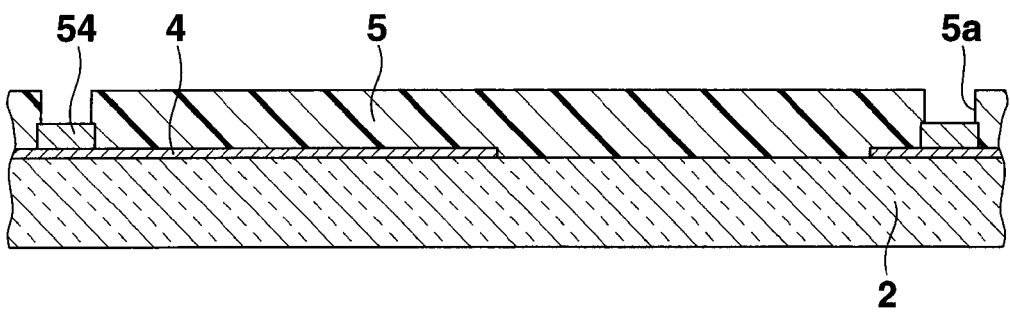
FIG. 12 is a cross sectional view to explain a manufacturing step to manufacture the organic EL display panel 10 of a cross sectional view shown in FIG. 3.

Next, as shown in FIG. 11, the flattening film 5 is formed. Next, dry etching is performed on the flattening film 5 to form the contact hole 5a as shown in FIG. 12.

Figure 13:
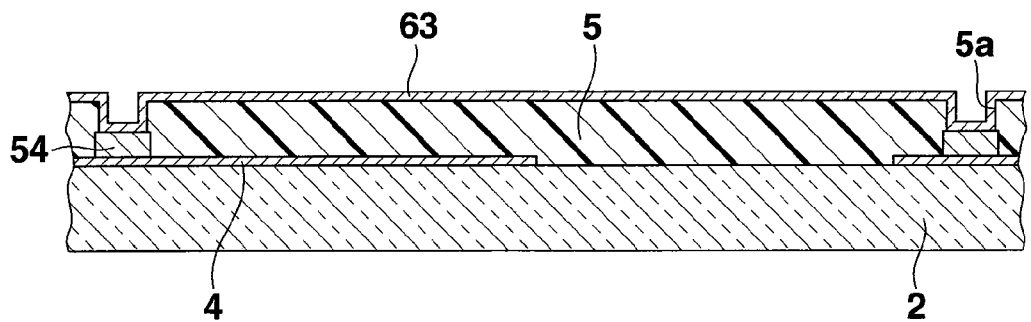
FIG. 13 is a cross sectional view to explain a manufacturing step to manufacture the organic EL display panel 10 of a cross sectional view shown in FIG. 3.
Figure 14:
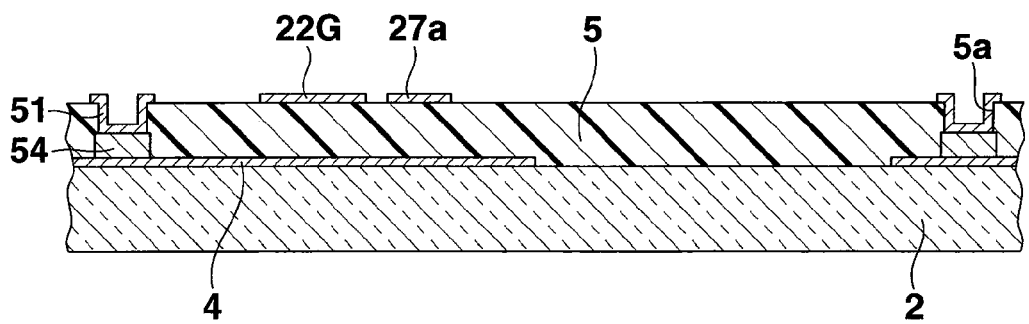
FIG. 14 is a cross sectional view to explain a manufacturing step to manufacture the organic EL display panel 10 of a cross sectional view shown in FIG. 3.

Next, as shown in FIG. 13, a gate metal layer 63 is formed by a metal such as Al, AlTi, AlTiNd, etc. Next, as shown in FIG. 14, the gate metal layer 63 is patterned to form the gate electrode 21G and 22G, the electrode 27a and signal line 51.

Figure 15:
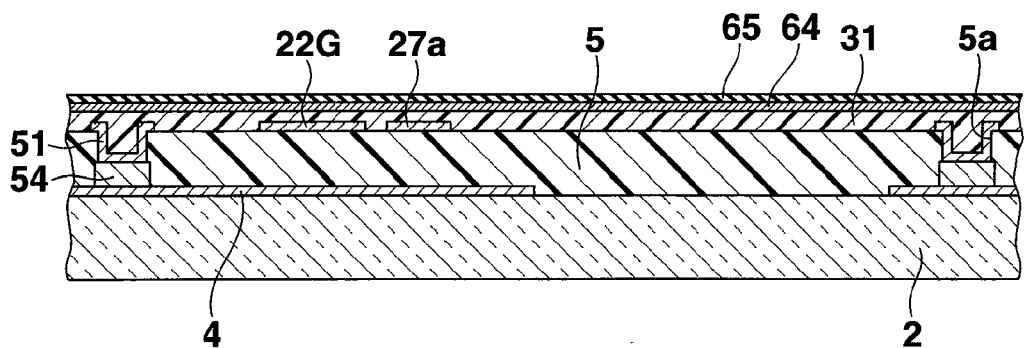
FIG. 15 is a cross sectional view to explain a manufacturing step to manufacture the organic EL display panel 10 of a cross sectional view shown in FIG. 3.

Next, as shown in FIG. 15, the gate insulating film 31 is formed.

Figure 16:
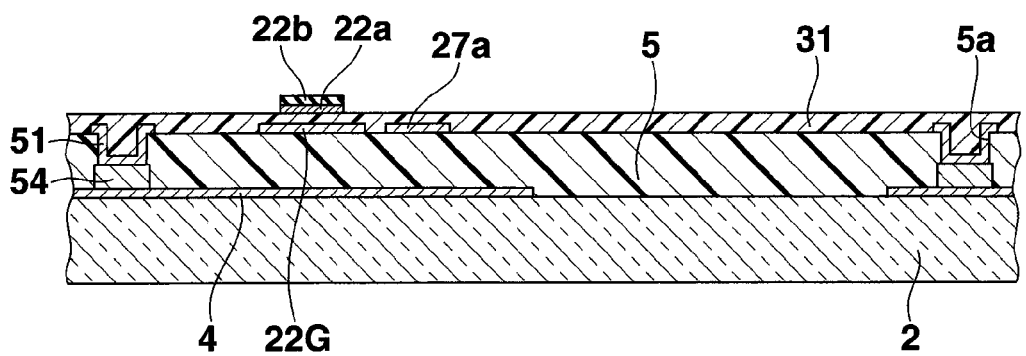
FIG. 16 is a cross sectional view to explain a manufacturing step to manufacture the organic EL display panel 10 of a cross sectional view shown in FIG. 3.

Next, an amorphous silicon layer 64 which is to be the semiconductor film 21a and 22a, and an insulating film 65 which is to be the channel protecting film 21b and 22b are formed in this order on the gate insulating film 31. Next, as shown in FIG. 16, the amorphous silicon layer 64 and the insulating film 65 are patterned to form the semiconductor film 21a and 22a and the channel protecting film 21b and 22b.

Figure 17:
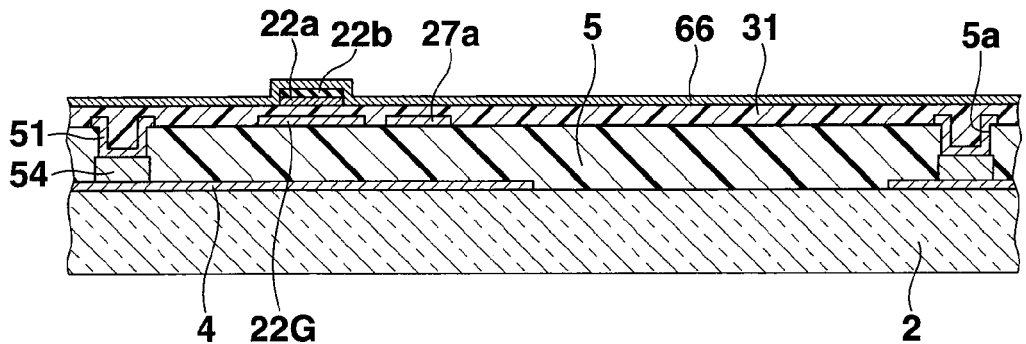
FIG. 17 is a cross sectional view to explain a manufacturing step to manufacture the organic EL display panel 10 of a cross sectional view shown in FIG. 3.
Figure 18:
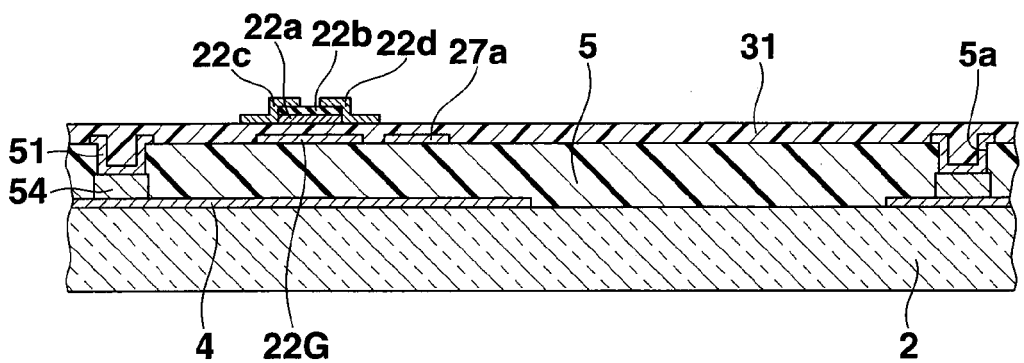
FIG. 18 is a cross sectional view to explain a manufacturing step to manufacture the organic EL display panel 10 of a cross sectional view shown in FIG. 3.

Next, as shown in FIG. 17, impurity layer 66 which is to be the n-type semiconductor film 21c, 21d, 22c and 22d is formed. Next, as shown in FIG. 18, the impurity layer 66 is patterned to form the n-type semiconductor film 21c, 21d, 22c and 22d.

Figure 19:
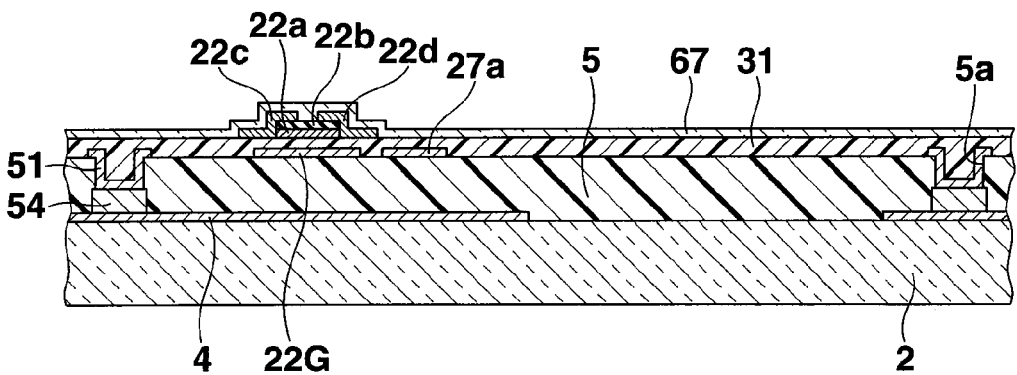
FIG. 19 is a cross sectional view to explain a manufacturing step to manufacture the organic EL display panel 10 of a cross sectional view shown in FIG. 3.
Figure 20:
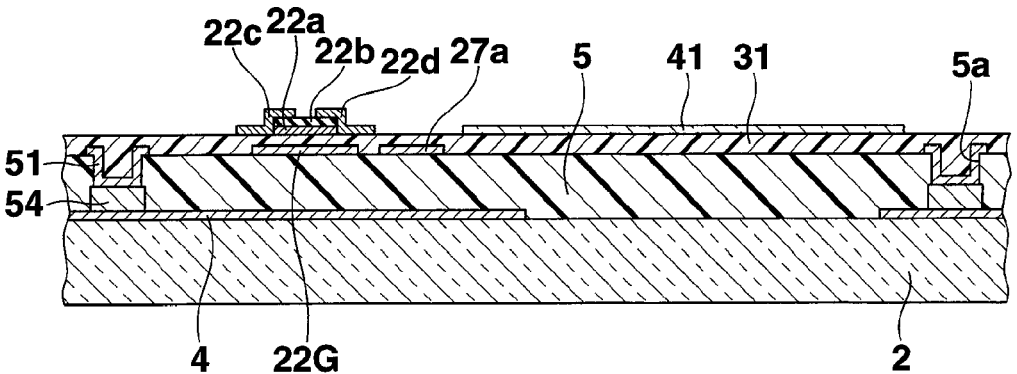
FIG. 20 is a cross sectional view to explain a manufacturing step to manufacture the organic EL display panel 10 of a cross sectional view shown in FIG. 3.

Next, as shown in FIG. 19, a transparent electrode film 67 such as an ITO is formed. Next, as shown in FIG. 20, the transparent electrode film 67 is patterned to form the pixel electrode 41.

Figure 21:
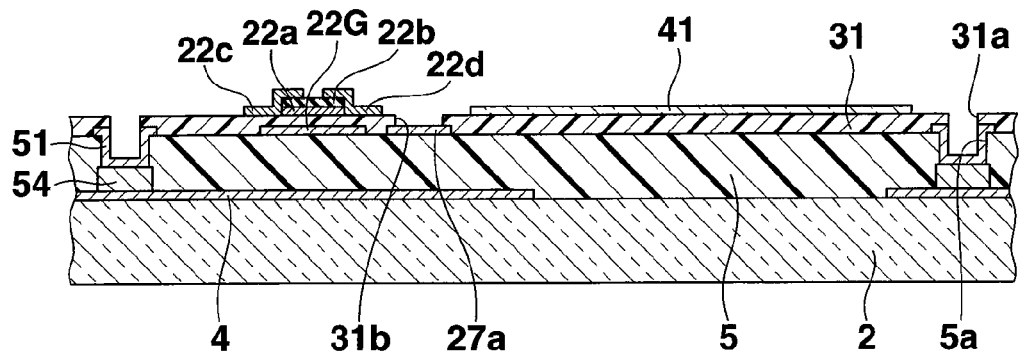
FIG. 21 is a cross sectional view to explain a manufacturing step to manufacture the organic EL display panel 10 of a cross sectional view shown in FIG. 3.

Next, as shown in FIG. 21, dry etching is performed on the gate insulating film 31 to form the contact holes 31a, 31b and 31c.

Figure 22:
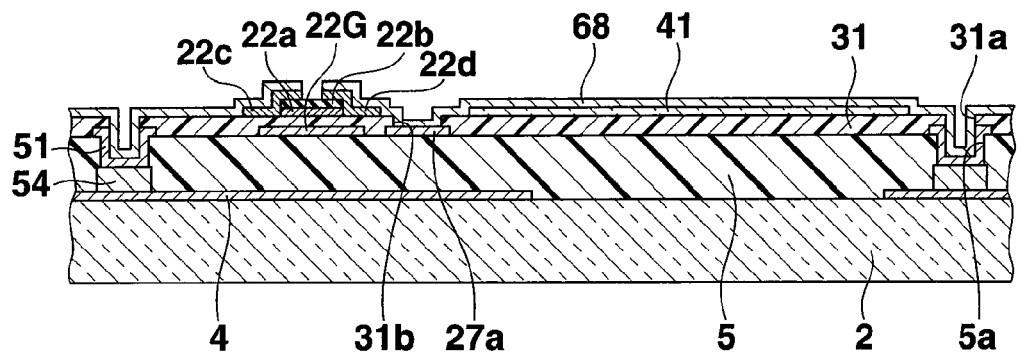
FIG. 22 is a cross sectional view to explain a manufacturing step to manufacture the organic EL display panel 10 of a cross sectional view shown in FIG. 3.
Figure 23:
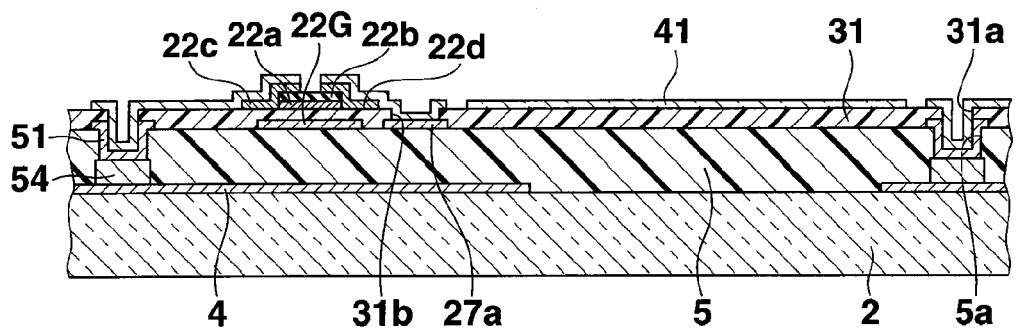
FIG. 23 is a cross sectional view to explain a manufacturing step to manufacture the organic EL display panel 10 of a cross sectional view shown in FIG. 3.

Next, as shown in FIG. 22, the drain metal layer 68 is formed. Next, as shown in FIG. 23, the drain metal layer 68 is patterned to form the electrode 27b, the source electrodes 21S and 22S, and the drain electrodes 21D and 22D, scanning line 52 and common power source line 53.

Figure 24:
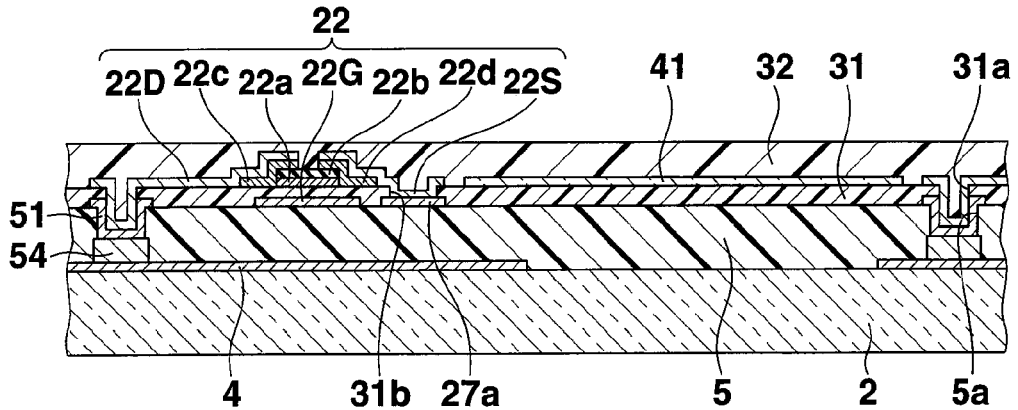
FIG. 24 is a cross sectional view to explain a manufacturing step to manufacture the organic EL display panel 10 of a cross sectional view shown in FIG. 3.
Figure 25:
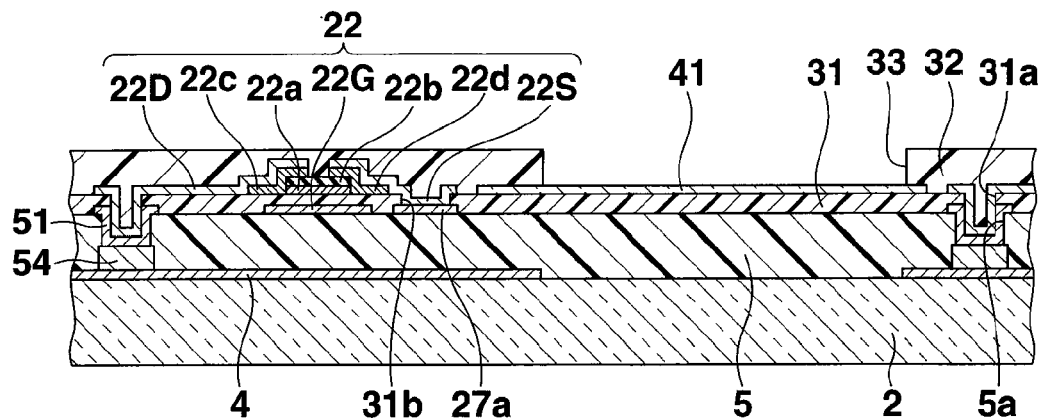
FIG. 25 is a cross sectional view to explain a manufacturing step to manufacture the organic EL display panel 10 of a cross sectional view shown in FIG. 3.

Next, as shown in FIG. 24, the protective insulating film 32 is formed. Next, as shown in FIG. 25, the opening section 33 is formed in the protective insulating film 32 and at least a portion of the pixel electrode 41 is exposed.

Figure 26:
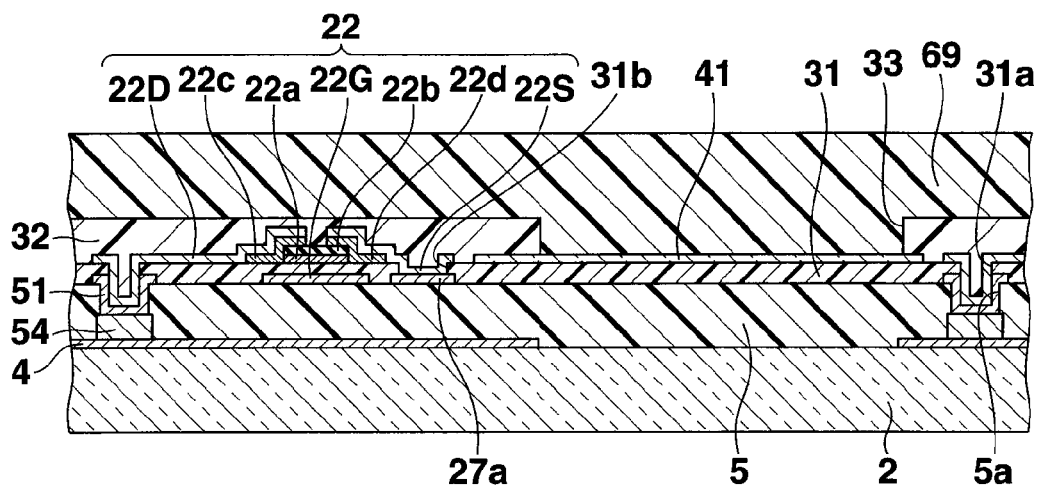
FIG. 26 is a cross sectional view to explain a manufacturing step to manufacture the organic EL display panel 10 of a cross sectional view shown in FIG. 3.
Figure 27:
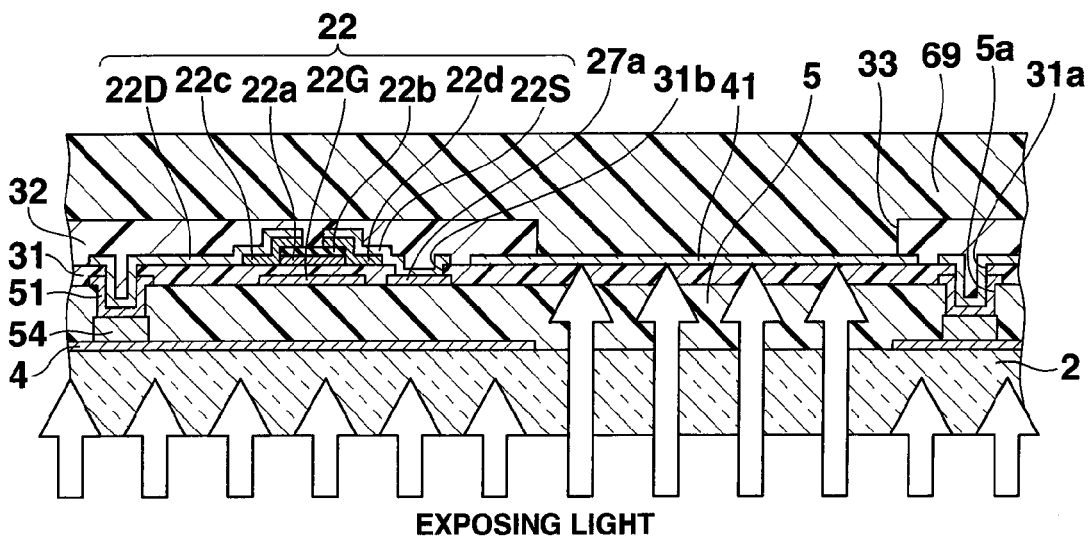
FIG. 27 is a cross sectional view to explain a manufacturing step to manufacture the organic EL display panel 10 of a cross sectional view shown in FIG. 3.
Figure 28:
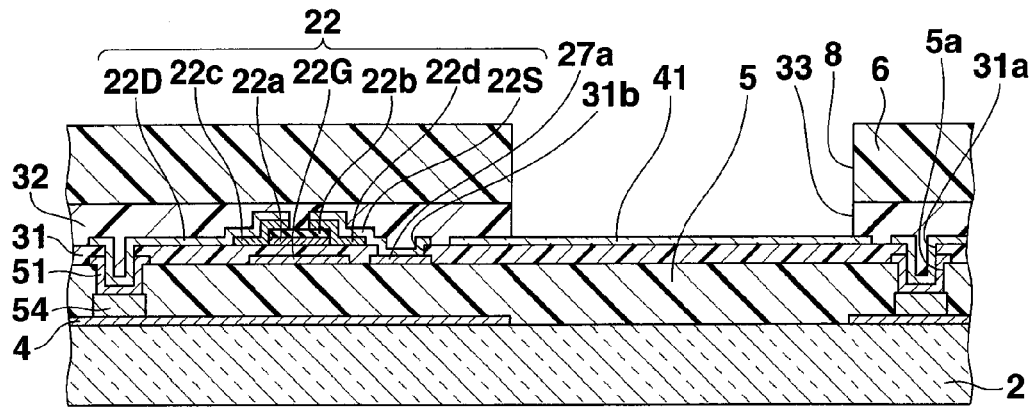
FIG. 28 is a cross sectional view to explain a manufacturing step to manufacture the organic EL display panel 10 of a cross sectional view shown in FIG. 3.

Next, as shown in FIG. 26, a positive type photosensitive resin material 69 of a polyimide system, etc. is applied. Next, as shown in FIG. 27, light is exposed to the photosensitive resin material 69 from the insulating substrate 2 side with the light blocking film 4, scanning line 52, and common power source line 53 as the mask. Next, the solubilized photosensitive resin material 69 of a portion where light is exposed is removed. Then, as shown in FIG. 28, developing processing is performed to form a dividing wall 6 including an opening with a shape corresponding to the shape of the light blocking film 4, scanning line 52 and common power source line 53.

A gap between the scanning line 52 and the common power source line 53 which is a portion covered by the protective insulating film 32 remains as the dividing wall 6 because the width is narrow and the portion exposed to light does not come into contact with the developing liquid.

Figure 29:
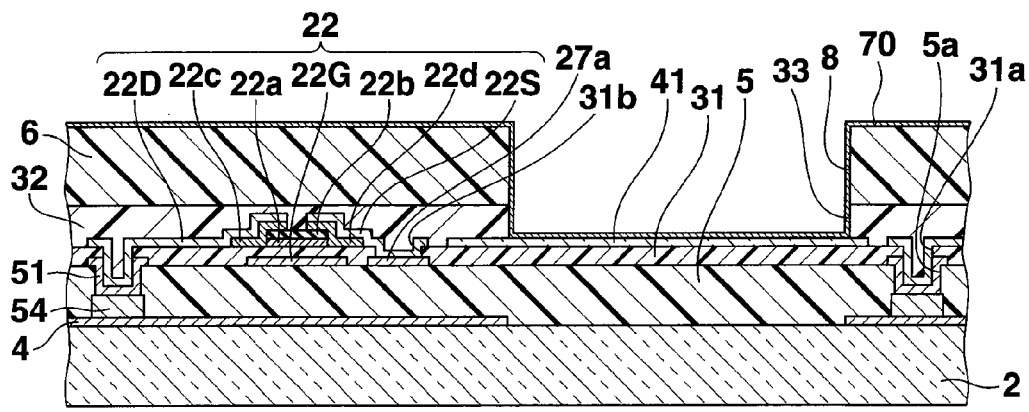
FIG. 29 is a cross sectional view to explain a manufacturing step to manufacture the organic EL display panel 10 of a cross sectional view shown in FIG. 3.
Figure 30:
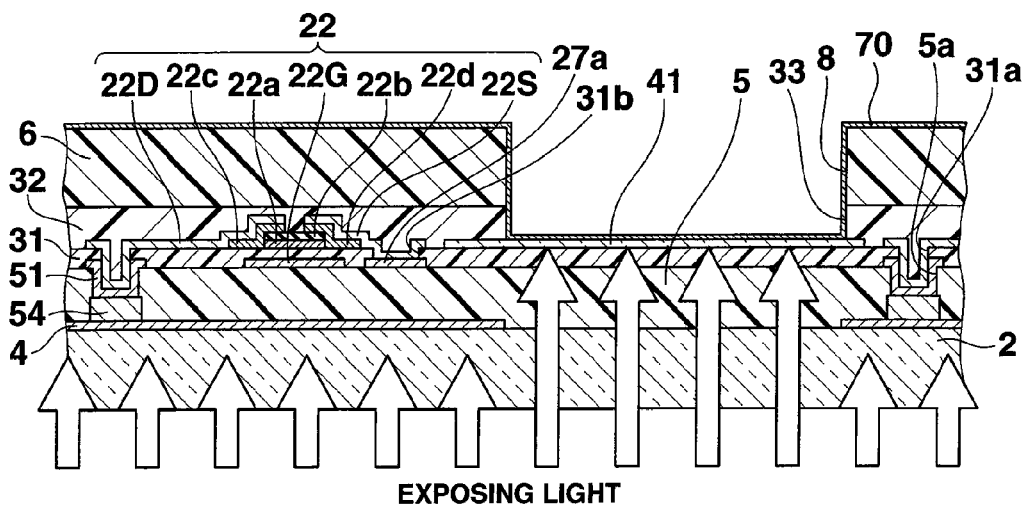
FIG. 30 is a cross sectional view to explain a manufacturing step to manufacture the organic EL display panel 10 of a cross sectional view shown in FIG. 3.
Figure 31:
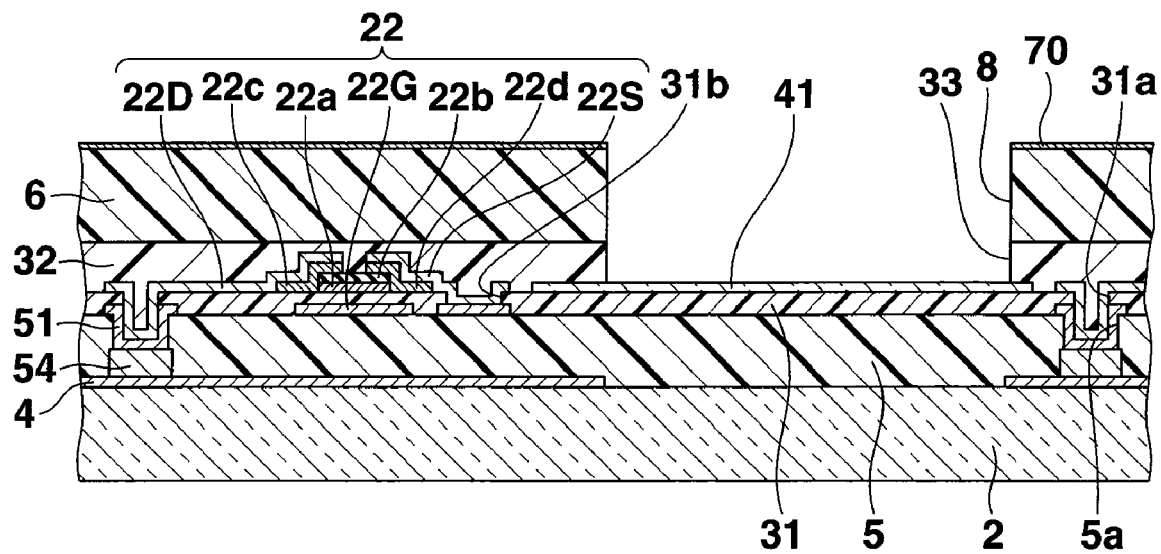
FIG. 31 is a cross sectional view to explain a manufacturing step to manufacture the organic EL display panel 10 of a cross sectional view shown in FIG. 3.

Next, as shown in FIG. 29, the liquid repellent agent 70 composed of a compound including a heterocycle including at least one nitrogen atom on the cycle, a plurality of thiol groups, and an alkyl fluoride group connected through the thiol group such as the triazine thiol alkyl fluoride derivative is applied. Next, as shown in FIG. 30, the liquid repelling agent 70 is exposed to light from the insulating substrate 2 side with the light blocking film 4, the scanning line 52 and the common power source line 53 as the mask. As shown in FIG. 31, the light repellent agent 70 is degraded by the light reaction, and therefore only the upper surface of the dividing wall 6 where light is blocked is selectively processed by liquid repellent processing. With this, the transistor array panel 100 is completed.

Figure 32:
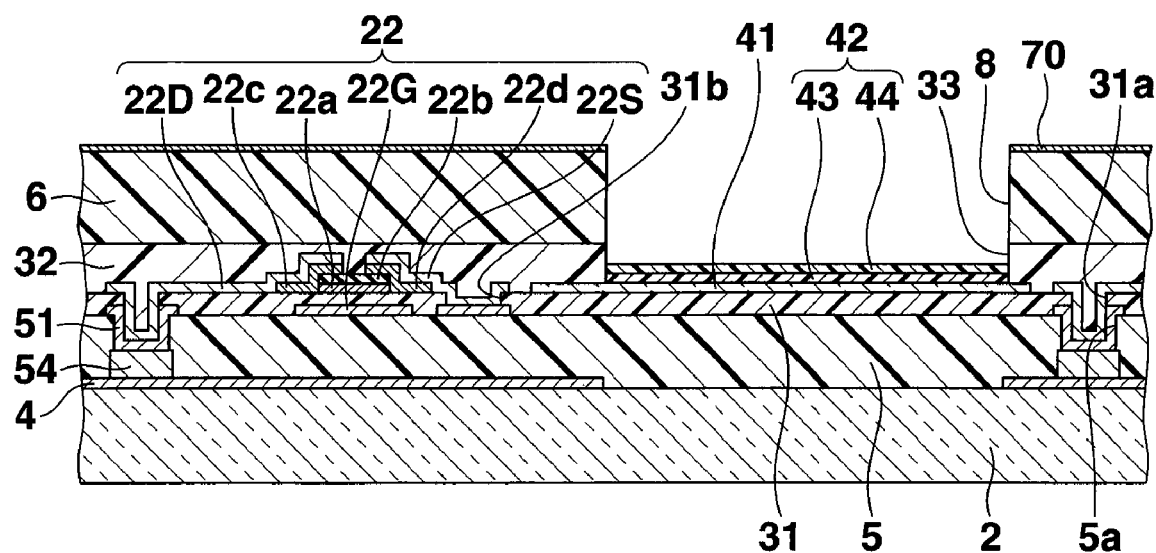
FIG. 32 is a cross sectional view to explain a manufacturing step to manufacture the organic EL display panel 10 of a cross sectional view shown in FIG. 3.

Next, as shown in FIG. 32, a liquid including an organic compound where the hole injecting material (for example, PEDOT which is a conductive polymer and PSS which is a dopant) is dissolved in water is applied to the pixel electrode 41. As a method to apply the liquid, an inkjet printing method (droplet discharging method) or other printing method can be used, or a coating method such as a dip coat method, spin coat method, etc. can be used.

Then, in a state exposed to the air, the transistor array panel 100 is dried at a temperature of 160 to 200° C. using a hot plate and the residual solvent is removed to form the hole injecting layer 43.

Next, conjugated polymer light emitting material where the light emitting color is red, green and blue are dissolved in an organic solvent (for example, tetralin, tetramethylbenzene, mesitylene) and a liquid including organic compound for each color of red, green and blue is prepared. Then, the liquid including organic compound for red is applied on the hole injecting layer 43 of the red sub-pixel, the liquid including organic compound for green is applied on the hole injecting layer 43 of the green sub-pixel and the liquid including organic compound for blue is applied on the hole injecting layer 43 of the blue sub-pixel. With this, the light emitting layer 44 is formed on the hole injecting layer 43. As a method of application, inkjet printing method (droplet discharging method), or other printing method is used to perform applying according to color.

Next, the transistor array panel 100 is dried in an inert gas atmosphere (for example, nitrogen gas atmosphere) with a hot plate and the residual solvent is removed. Also, drying using a sheathed heater, infrared heater, etc. in vacuum can also be performed. When the hole injecting layer 43 and the light emitting layer 44 is formed by a wet type applying method, since liquid repellent processing is performed on the upper surface of the dividing wall 6, the liquid including organic compound applied on adjacent pixel electrodes 41 do not cross over the dividing wall 6 and are not mixed. Therefore, the hole injecting layer 43 can be formed separately with respect to each pixel electrode 41.

Next, as shown in FIG. 3 to FIG. 5, the electron injecting layer 45 is formed on the light emitting layer 44, protective insulating layer 32 and the dividing wall 6 with the vapor deposition method. Then, a metal layer is formed on the electron injecting layer 45 with an evaporation or sputtering method to form the opposing electrode 46. With this, the organic EL element 40 is formed on the transistor array panel 100.

Lastly, as shown in FIG. 6, an adhesive agent 3 is applied to the surrounding section of the face where the opposing electrode 46 of the substrate 2 is formed and the substrate 2 and the opposing substrate 9 are bond to seal the organic EL element 40. With this, the EL display panel 10 is completed.

As described above, according to the present embodiment, the dividing wall 6 can be formed from the insulating substrate 2 side with the light blocking film 4, the scanning line 52 and the common power source line 53 as the mask. Therefore, there is no concern of the mask shifting. Consequently, there is no need to provide a margin to prepare for the mask shifting, and the aperture ratio can be increased. The liquid repellent processing can be performed selectively only on the upper surface of the dividing wall 6 from the insulating substrate 2 side with the light blocking film 4, the scanning line 52 and the common power source line 53 as the mask. Therefore, there is no need to provide a separate photomask, and alignment is not necessary. Consequently, the number of photomasks can be reduced, the number of steps of the manufacturing can be reduced and the manufacturing cost can be reduced.

The present invention is not limited to the above described embodiments and various modifications and changes in design can be made without leaving the scope of the invention. For example, in the above described embodiment, a display apparatus such as an EL display panel is described, however, the present invention is not limited to the above and for example, the present invention can be applied to a light exposing device such as a printer head, etc.

Also, according to the present embodiment, the scanning line 52 and the common power source line 53 are provided in a direction intersecting with the light blocking film 4, however, the present invention is not limited to this, and only either one of the scanning line 52 or the common power source line 53 can be provided in a direction intersecting with the light blocking film 4. Alternatively, the light blocking film 4 can be provided in a direction intersecting with the signal line 51.

Also, according to the present embodiment, the opening section 8 is provided so that at least a portion of the pixel electrode 41 is exposed, however, the present invention is not limited to this, and the opening section 8 can be provided so that the entire pixel electrode 41 is exposed.

The entire disclosure of Japanese Patent Application No. 2009-211230 filed on Sep. 14, 2009 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

According to an aspect of the preferred embodiments of the present invention, there is provided a light emitting panel including:

a light blocking section formed above a substrate, the light blocking section including an opening;

a first electrode formed above the opening of the light blocking section;

a dividing wall including an opening so that at least a portion of the first electrode is exposed, the opening corresponding to a shape of the opening of the light blocking section;

a second electrode formed above the first electrode; and a carrier transport layer composed of at least one layer formed between the first electrode and the second electrode.

Preferably, in the light emitting panel, the light blocking section is formed from conductive material.

Preferably, the light emitting panel further includes a pixel transistor to control electric power supply to the first electrode, wherein the light blocking section blocks light to the pixel transistor.

Preferably, in the light emitting panel, the light blocking section includes a line and the line is connected to the pixel transistor.

Preferably, in the light emitting panel, the light blocking section is in a conduction state with any line connected to the pixel transistor.

Preferably, in the light emitting panel, the dividing wall includes a first dividing wall formed from photosensitive resin material and a second dividing wall provided below the first dividing wall.

Preferably, in the light emitting panel, liquid repellent processing is performed on only an upper surface of the first dividing wall.

According to an aspect of the preferred embodiments of the present invention, there is provided a manufacturing method of a light emitting panel including a first electrode formed on a substrate; a second electrode formed above the first electrode; a carrier transport layer composed of at least one layer formed between the first electrode and the second electrode, the method including:

applying a positive type photosensitive resin on an upper side of the substrate provided with a light blocking section including an opening;

forming a dividing wall including an opening with a shape corresponding to a shape of the opening of the light blocking section by emitting light to the positive type photosensitive resin side from a bottom surface of the substrate with the light blocking section as a mask.

Preferably, the manufacturing method of the light emitting panel further includes forming the first electrode including light permeability before applying the positive type photosensitive resin.

Preferably, the manufacturing method of the light emitting panel further includes applying a liquid repellent agent on the dividing wall and inside the opening, emitting light from the bottom surface of the substrate and degrading the liquid repellent agent inside the opening after forming the dividing wall including the opening.

Preferably, in the manufacturing method of the light emitting panel, the liquid repellent agent is composed of a compound including a heterocycle including at least one nitrogen atom on the cycle, a plurality of thiol groups, and an alkyl fluoride group connected through the thiol group.

Preferably, the manufacturing method of the light emitting panel further includes forming a pixel transistor to control electric power supply to the first electrode above the light blocking section before applying the positive type photosensitive resin.

Preferably, in the manufacturing method of the light emitting panel, the light blocking section includes a line and the line is connected to the pixel transistor.

Preferably, in the manufacturing method of the light emitting panel, the light blocking section is in a conduction state with any line connected to the pixel transistor.

According to an aspect of the preferred embodiments of the present invention, there is provided a light emitting panel including a first electrode formed on a substrate; a second electrode formed above the first electrode; a carrier transport layer composed of at least one layer formed between the first electrode and the second electrode, the light emitting panel including:

a dividing wall including an opening in a shape corresponding to a shape of an opening of a light blocking section, the dividing wall formed by applying a positive type photosensitive resin on an upper surface side of the substrate provided with the light blocking section including the opening and emitting light to the positive type photosensitive resin side from a bottom surface of the substrate with the light blocking section as a mask.

Preferably, the light emitting panel further includes a liquid repellent layer formed only on an upper surface of the dividing wall by applying a liquid repellent agent on the dividing wall and inside the opening, emitting light from the bottom surface of the substrate and degrading the liquid repellent agent inside the opening.

What is claimed is:

1. A manufacturing method of a light emitting panel including a first electrode formed on a substrate, a second electrode formed above the first electrode, and a carrier transport layer comprising at least one layer formed between the first electrode and the second electrode, the method comprising:

applying a positive type photosensitive resin on an upper side of the substrate provided with a light blocking section including an opening;

forming a dividing wall including an opening with a shape corresponding to a shape of the opening of the light blocking section by emitting light to the positive type photosensitive resin from a bottom surface of the substrate with the light blocking section as a mask;

applying a liquid repellent agent on the dividing wall and inside the opening; and emitting light from the bottom surface of the substrate and degrading the liquid repellent agent inside the opening after forming the dividing wall including the opening;

wherein the liquid repellent agent comprises a compound including a heterocycle including at least one nitrogen atom on the cycle, a plurality of thiol groups, and an alkyl fluoride group connected through the thiol group.

2. The manufacturing method of the light emitting panel according to claim 1, further comprising forming the first electrode, having light permeability, before applying the positive type photosensitive resin.

3. The manufacturing method of the light emitting panel according to claim 1, further comprising forming a pixel transistor to control electric power supply to the first electrode above the light blocking section before applying the positive type photosensitive resin.

4. The manufacturing method of the light emitting panel according to claim 3, wherein the light blocking section includes a line and the line is connected to the pixel transistor.

5. The manufacturing method of the light emitting panel according to claim 3, wherein the light blocking section is in a conduction state with any line connected to the pixel transistor.

6. A manufacturing method a light emitting panel including a first electrode formed on a substrate, a second electrode formed above the first electrode, and a carrier transport layer comprising at least one layer formed between the first electrode and the second electrode, the method comprising:

applying a positive type photosensitive resin on an upper side of the substrate provided with a light blocking section including an opening;

forming a dividing wall including an opening with a shape corresponding to a shape of the opening of the light blocking section by emitting light to the positive type photosensitive resin from a bottom surface of the substrate with the light blocking section as a mask; and applying a liquid repellent agent on the dividing wall;

wherein the liquid repellent agent comprises a compound including a heterocycle including at least one nitrogen atom on the cycle, a plurality of thiol groups, and an alkyl fluoride group connected through the thiol group.

* * * * *

UNITED STATES PATENT AND TRADEMARK OFFICE
CERTIFICATE OF CORRECTION

PATENT NO. : 8,354,285 B2  
APPLICATION NO. : 12/880341  
DATED : January 15, 2013  
INVENTOR(S) : Satoru Shimoda Page 1 of 1

It is certified that error appears in the above-identified patent and that said Letters Patent is hereby corrected as shown below:

Column 12, Line 65; Claim 6, Line 1:

After "method" insert --of--.

Signed and Sealed this  
Ninth Day of April, 2013

Teresa Stanek Rea  
*Acting Director of the United States Patent and Trademark Office*